US010372695B2

(12) United States Patent
Guilford et al.

(10) Patent No.: US 10,372,695 B2
(45) Date of Patent: Aug. 6, 2019

(54) TECHNOLOGIES FOR COMPUTING ROLLING HASHES

(71) Applicant: Intel Corporation, Santa Clara, CA (US)

(72) Inventors: James D. Guilford, Northborough, MA (US); Vinodh Gopal, Westborough, MA (US); Gregory B. Tucker, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 718 days.

(21) Appl. No.: 14/583,669

(22) Filed: Dec. 27, 2014

(65) Prior Publication Data

US 2016/0188589 A1    Jun. 30, 2016

(51) Int. Cl.
*G06F 16/22* (2019.01)
*G06F 16/174* (2019.01)
*G06F 16/23* (2019.01)

(52) U.S. Cl.
CPC ...... *G06F 16/2255* (2019.01); *G06F 16/1748* (2019.01); *G06F 16/2365* (2019.01)

(58) Field of Classification Search
CPC .......... G06F 17/3033; G06F 17/30156; G06F 17/30371; G06F 16/2255; G06F 16/1748; G06F 16/2365
See application file for complete search history.

(56) References Cited

U.S. PATENT DOCUMENTS

| 5,454,039 | A | * | 9/1995 | Coppersmith | .......... G06F 21/31 |
| | | | | | 380/28 |
| 5,990,810 | A | * | 11/1999 | Williams | .............. G06F 3/0608 |
| | | | | | 341/51 |
| 7,287,046 | B2 | * | 10/2007 | Bulka | ............... G06F 17/30067 |
| 7,325,059 | B2 | * | 1/2008 | Barach | .................... H04L 45/00 |
| | | | | | 709/225 |

(Continued)

FOREIGN PATENT DOCUMENTS

| TW | 200835174 A | 8/2008 |
| TW | I366775 B | 6/2012 |
| WO | 2014-184857 | 11/2014 |

OTHER PUBLICATIONS

D. Geer, D. Geer, D. Geer and D. Geer, "Reducing the Storage Burden via Data Deduplication," in Computer, vol. 41, No. 12, pp. 15-17, Dec. 2008. (Year: 2008).*

(Continued)

*Primary Examiner* — Mariela Reyes
*Assistant Examiner* — Alp Onat
(74) *Attorney, Agent, or Firm* — Barnes & Thornburg LLP

(57) ABSTRACT

Technologies for computing rolling hashes include a computing device having a first hash table that includes a first plurality of random-valued entries and a second hash table that includes a second plurality of random-valued entries. The computing device retrieves a block of data from a data buffer and generates a hash based on the block of data, a previously generated hash, the first hash table, and the second hash table. The computing device further determines whether the generated hash matches a predefined trigger and records a data boundary in response to a determination that the generated hash matches the trigger.

23 Claims, 4 Drawing Sheets

(56) References Cited

U.S. PATENT DOCUMENTS

| | | | |
|---|---|---|---|
| 7,760,873 B2* | 7/2010 | Gueron | H04L 9/302 380/277 |
| 7,844,581 B2* | 11/2010 | Dubnicki | G06F 17/30159 707/693 |
| 8,214,517 B2* | 7/2012 | Dubnicki | G06F 11/1453 707/693 |
| 8,490,203 B1 | 7/2013 | Ren | |
| 8,762,345 B2* | 6/2014 | Miller | H03M 7/3084 707/662 |
| 9,069,787 B2* | 6/2015 | Miller | H03M 7/3084 |
| 2005/0030954 A1* | 2/2005 | Dropps | H04L 45/00 370/395.31 |
| 2006/0085561 A1* | 4/2006 | Manasse | G06F 16/174 709/247 |
| 2008/0002825 A1* | 1/2008 | Gueron | H04L 9/302 380/30 |
| 2008/0133446 A1* | 6/2008 | Dubnicki | G06F 17/30159 |
| 2008/0133561 A1* | 6/2008 | Dubnicki | G06F 11/1453 |
| 2008/0301134 A1* | 12/2008 | Miller | G06F 17/30156 |
| 2009/0019246 A1* | 1/2009 | Murase | G06F 1/3203 711/162 |
| 2010/0023726 A1* | 1/2010 | Aviles | G06F 12/0813 711/216 |
| 2010/0088512 A1* | 4/2010 | Schwartz | G06F 17/3089 713/168 |
| 2010/0088517 A1* | 4/2010 | Piersol | H04L 9/3236 713/171 |
| 2010/0257176 A1* | 10/2010 | Lu | G06F 17/30949 707/741 |
| 2012/0023127 A1* | 1/2012 | Kirshenbaum | G06Q 30/0201 707/769 |
| 2013/0073528 A1* | 3/2013 | Aronovich | G06F 7/00 707/692 |
| 2013/0226883 A1 | 8/2013 | Klose | |
| 2013/0339407 A1* | 12/2013 | Sharpe | G06F 17/30194 707/827 |
| 2014/0279952 A1 | 9/2014 | Akirav et al. | |
| 2014/0304241 A1* | 10/2014 | Miller | H03M 7/3084 707/692 |
| 2015/0019499 A1* | 1/2015 | Aronovich | G06F 17/30097 707/692 |
| 2015/0019505 A1* | 1/2015 | Aronovich | G06F 17/30156 707/692 |
| 2015/0019506 A1* | 1/2015 | Aronovich | G06F 17/30156 707/692 |

OTHER PUBLICATIONS

"Rabin-Karp algorithnm", downloaded from http://en.wikipedia.org/wiki/Rabin%E2%80%93Karp_algorithm, retrieved Nov. 11, 2014.

"Rabin fingerprinting", downloaded from http://www.cs.utah.edu/~shanth/stuff/research/dup_elim/final.txt, retrieved Nov. 11, 2014.

International Search Report for PCT/US15/062680, dated May 4, 2016 (3 pages).

Written Opinion for PCT/US15/062680, dated May 4, 2016 (4 pages).

Office Action, Search Report, and English Translation for Taiwan Patent Application No. 104139409, dated Feb. 20, 2017, 9 pages.

Office Action, Search Report, and English Translation for Taiwan Patent Application No. 104139409, dated Sep. 18, 2017, 12 pages.

Extended European search report dated Apr. 24, 2018 for European Patent Application No. 15874036.5-1222, 10 pages.

Andrei Z. Broder, "Some applications of Rabin's fingerprinting method", Sequences H: Methods in communications, Security, and Computer Science, Dec. 31, 1993, pp. 4-10.

* cited by examiner

TECHNOLOGIES FOR COMPUTING ROLLING HASHES

BACKGROUND

Data de-duplication involves finding similarities (e.g., copies) in data files and compressing or otherwise reducing the utilized memory based on those identified similarities. For example, instead of storing duplicate data at various locations in memory, a single copy of that data may be stored and the duplicated instances may be replaced with a reference (e.g., a pointer) to the single copy. It should be appreciated that the reference often requires significantly less memory to store than the duplicate copies of the data.

The algorithms associated with identifying the duplicates themselves tend to be the more computationally intensive aspects of data de-duplication and are often executed on general-purpose processors (e.g., the main processors) of computing devices. As such, the speed and quality of those algorithms is paramount. Some algorithms for identifying data duplication or, more specifically, for identifying natural boundaries of data "chunks" include a rolling hash or fingerprint in which hashes of a set of contiguous bytes of fixed size (e.g., within the hash window) are computed on a rolling basis. A simple algorithm may involve computing the hash of the contiguous bytes at every location, whereas more sophisticated algorithms such as Rabin-Karp fingerprinting attempt to reduce computational overhead by incrementally adding the contribution of the next byte in the data buffer and subtracting the contribution of the byte that is no longer within the hash window (i.e., the "oldest" byte).

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
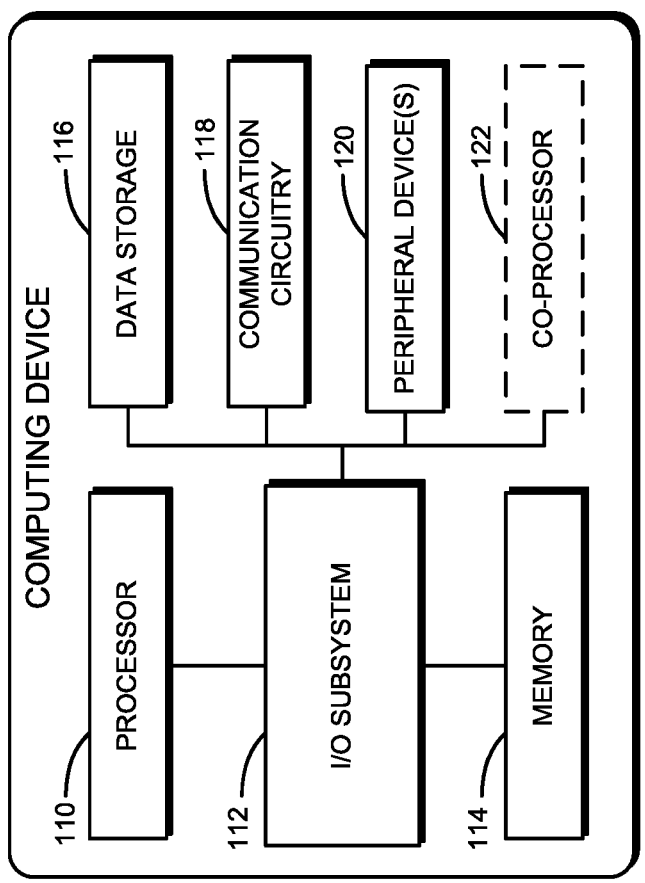
FIG. 1 is a simplified block diagram of at least one embodiment of a computing device for computing rolling hashes.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C): (A and B); (B and C); (A and C); or (A, B, and C). Similarly, items listed in the form of "at least one of A, B, or C" can mean (A); (B); (C): (A and B); (B and C); (A and C); or (A, B, and C).

The disclosed embodiments may be implemented, in some cases, in hardware, firmware, software, or any combination thereof. The disclosed embodiments may also be implemented as instructions carried by or stored on one or more transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Referring now to FIG. 1, a computing device 100 for computing rolling hashes is shown. As described in detail below, the computing device 100 is configured to compute rolling hashes in a manner that reduces the computational overhead of searching algorithms (e.g., Rabin-Karp, secure hash algorithm (SHA), etc.) while providing quality identification of natural data boundaries. For example, in the illustrative embodiment, a data block boundary is constructed or identified based on the computed rolling hash matching some trigger criteria. As described below, the rolling hash may be a function of the previous w bytes retrieved from the data buffer (i.e., the bytes within the hash window of length w bytes). It should be appreciated that the size of the hash window, w, may be chosen to be large enough to ensure that repeated w-byte data strings are uncommon. In some embodiments, if two data files have the same w-byte data string that matches a trigger (i.e., data against which the hashes are compared), both of those data files will construct a block boundary at that point (e.g., to define data chunks for data de-duplication purposes). Further, in some embodiments, the trigger may be chosen based on an average expected block size and/or may include checking one or more of the most significant and/or least significant bits of the rolling hash (e.g., 13 bits) against some fixed value (e.g., zero or some nonzero value). As such, in some embodiments, a bitmask may be utilized to isolate a set of bits of the rolling hash (e.g., the least significant or most significant bits) for comparison to the trigger. Further, it should be appreciated that the computing device 100 may include an application programming interface (API) that permits the hash algorithm to be embedded into an efficient library function.

The computing device 100 may be embodied as any type of computing device capable of performing the functions described herein. For example, the computing device 100 may be embodied as a desktop computer, server, router, switch, laptop computer, tablet computer, notebook, netbook, Ultrabook™, cellular phone, smartphone, wearable computing device, personal digital assistant, mobile Internet device, Hybrid device, and/or any other computing/communication device. As shown in FIG. 1, the illustrative computing device 100 includes a processor 110, an input/output ("I/O") subsystem 112, a memory 114, a data storage 116, a communication circuitry 118, and one or more peripheral devices 120. Additionally, in some embodiments, the computing device 100 may also include a co-processor 122. Of course, the computing device 100 may include other or additional components, such as those commonly found in a typical computing device (e.g., various input/output devices and/or other components), in other embodiments. Additionally, in some embodiments, one or more of the illustrative components may be incorporated in, or otherwise form a portion of, another component. For example, the memory 114, or portions thereof, may be incorporated in the processor 110 in some embodiments.

The processor 110 may be embodied as any type of processor capable of performing the functions described herein. For example, the processor 110 may be embodied as a single or multi-core processor(s), digital signal processor, microcontroller, or other processor or processing/controlling circuit. Similarly, the memory 114 may be embodied as any type of volatile or non-volatile memory or data storage capable of performing the functions described herein. In operation, the memory 114 may store various data and software used during operation of the computing device 100 such as operating systems, applications, programs, libraries, and drivers. The memory 114 is communicatively coupled to the processor 110 via the I/O subsystem 112, which may be embodied as circuitry and/or components to facilitate input/output operations with the processor 110, the memory 114, and other components of the computing device 100. For example, the I/O subsystem 112 may be embodied as, or otherwise include, memory controller hubs, input/output control hubs, firmware devices, communication links (i.e., point-to-point links, bus links, wires, cables, light guides, printed circuit board traces, etc.) and/or other components and subsystems to facilitate the input/output operations. In some embodiments, the I/O subsystem 112 may form a portion of a system-on-a-chip (SoC) and be incorporated, along with the processor 110, the memory 114, and other components of the computing device 100, on a single integrated circuit chip.

The data storage 116 may be embodied as any type of device or devices configured for short-term or long-term storage of data such as, for example, memory devices and circuits, memory cards, hard disk drives, solid-state drives, or other data storage devices. The data storage 116 and/or the memory 114 may store various data during operation of the computing device 100 useful for performing the functions described herein. For example, the computing device 100 may store hash tables for computing the rolling hashes as described herein.

The communication circuitry 118 may be embodied as any communication circuit, device, or collection thereof, capable of enabling communications between the computing device 100 and other remote devices over a network. The communication circuitry 118 may be configured to use any one or more communication technologies (e.g., wireless or wired communications) and associated protocols (e.g., Ethernet, Bluetooth®, Wi-Fi®, WiMAX, etc.) to effect such communication.

The peripheral devices 120 may include any number of additional peripheral or interface devices, such as speakers, microphones, additional storage devices, and so forth. The particular devices included in the peripheral devices 120 may depend on, for example, the type and/or intended use of the computing device 100.

The co-processor 122 may be embodied as any hardware component(s) or circuitry capable of performing one or more of the functions described herein. For example, in some embodiments, the co-processor 122 may be embodied as a security co-processor, a manageability engine (ME), a converged security and manageability engine (CSME), a trusted platform module (TPM), a secure enclave such as Intel® Software Guard Extensions (SGX), or an out-of-band processor. In some embodiments, one or more of the functions described herein may be performed by the co-processor 122. However, in other embodiments, all of the functions may be performed by the processor 110.

Figure 2:
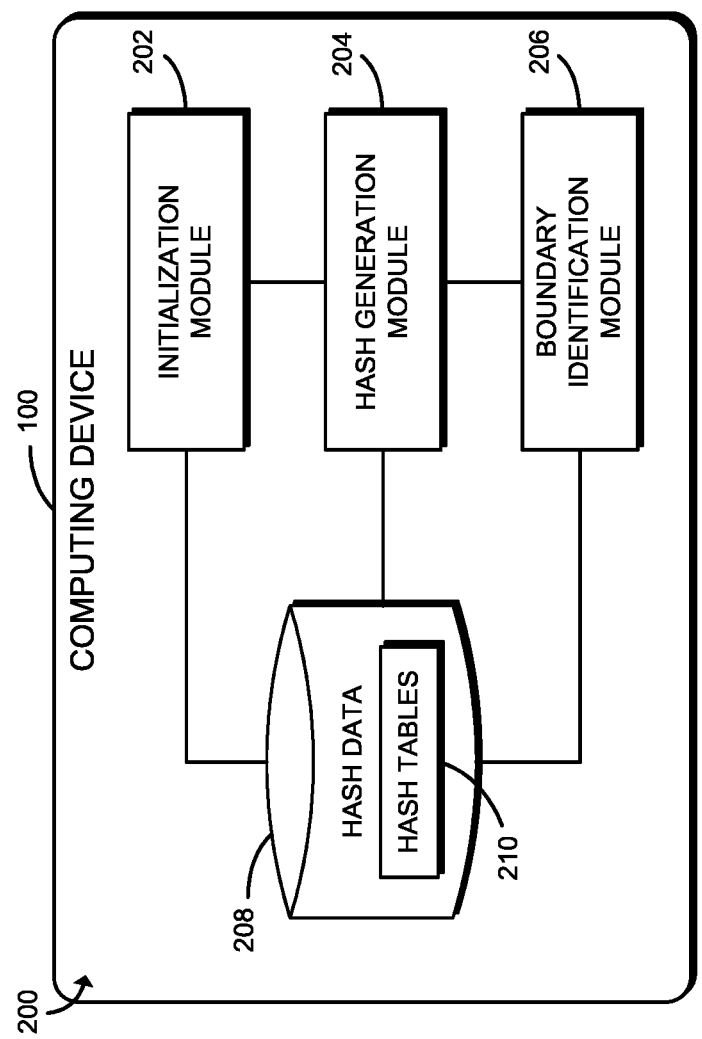
FIG. 2 is a simplified block diagram of at least one embodiment of an environment of the computing device of FIG. 1.

Referring now to FIG. 2, in use, the computing device 100 establishes an environment 200 for computing rolling hashes. The illustrative environment 200 of the computing device 100 includes an initialization module 202, a hash generation module 204, a boundary identification module 206, and hash data 208. The various modules of the environment 200 may be embodied as hardware, software, firmware, or a combination thereof. For example, the various modules, logic, and other components of the environment 200 may form a portion of, or otherwise be established by, the processor 110 or other hardware components of the computing device 100. As such, in some embodiments, one or more of the modules of the environment 200 may be embodied as a circuit or collection of electrical devices (e.g., an initialization circuit, a hash generation circuit, and/or a boundary identification circuit). Additionally, in some embodiments, one or more of the illustrative modules may form a portion of another module and/or one or more of the illustrative modules may be embodied as a standalone or independent module.

The initialization module 202 is configured to handle the initialization of various parameters and/or other hash data 208 associated with the rolling hash algorithm of the computing device 100. It should be appreciated that the particular hash data 208 initialized, defined, and/or utilized by the initialization module 202 may vary depending on the particular embodiment. In some embodiments, the hash data 208 may include hash tables 210, the hash window size (w), the bitmask and/or trigger associated with identification of a boundary, parameters of the data buffer, and/or other data associated with the operation of the rolling hash algorithm. For example, the initialization module 202 may initialize hash tables 210 for a particular hash window size, w, which may be predefined or otherwise determined. In particular, in some embodiments, the initialization module 202 may initialize a first hash table 210 with a plurality of random-valued entries and a second hash table 210 with another plurality of random-valued entries. For example, each of the hash tables 210 may include 256 64-bit random-valued entries. It should be appreciated that the random-valued entries may be calculated using any suitable algorithm, technique, and/or mechanism. For example, in some embodiments, the table entries are taken from the fraction part of $\pi$ or another irrational number, whereas in other embodiments the entries may be calculated based on a random number generator or another technique. As described herein, in some embodiments, the second hash table 210 includes the random-valued entries of the first hash table 210 but rotated (e.g., rotated left or rotated right) by a distance equal to the hash window size, w. In other words, each of the random-valued entries may be rotated left such that its index in the second hash table 210 is offset by w from its index in the first hash table 210. Further, in some embodiments, the initialization module 202 may determine an initial value at which to start the rolling hash (i.e., the initial value of the rolling hash). For example, the initial hash value may be set to zero, the value of the last w or other number of bytes, and/or another suitable hash value. It should be appreciated that, in some embodiments, the computing device 100 may initialize the rolling hash algorithm by virtue of a function of an API (e.g., an init( ) function).

The hash generation module 204 sequentially retrieves blocks of data (e.g., byte-sized blocks) from a data buffer and generates rolling hash values based on the previously generated hash, the hash window, and the hash tables 210. Of course, in some embodiments, the rolling hash values may be generated based on additional and/or alternative data. In the illustrative embodiment, in performing the rolling hash, the hash generation module 204 leverages the previously generated hash value. In particular, the hash generation module 204 includes the contribution of the newly retrieved block of data (e.g., the new byte) and excludes the contribution of the "oldest" block of data (e.g., the block of data no longer within the hash window). In doing so, in some embodiments, the hash generation module 204 may utilize rotation and exclusive-or bitwise operations. For example, in the illustrative embodiment, the hash generation module 204 generates the hash according to hash=(hash$_{prev}$<<<1)^table1[buf[i]]^table2[buf[i-w]], wherein hash$_{prev}$ is the previously generated hash (i.e., the hash calculated at the previous index or data block) hash$_{prev}$<<<1 denotes bitwise rotation of the previously generated hash, ^ denotes an exclusive-or bitwise operation, w is the hash window size, buf[i] is the retrieved block of data of the data buffer for which the hash is calculated, buf[i-w] is a previous block of data of the data buffer offset by an index difference equal to the hash window size, table1[buf[i]] is the random-valued entry of the first hash table 210 corresponding with the retrieved block of data, and table2[buf[i-w]] is the random-valued entry of the second hash table 210 corresponding with the previous block of data. Of course, it should be appreciated that the hash generation module 204 may utilize additional and/or alternative operations for computing rolling hashes in other embodiments.

The boundary identification module 206 determines whether the generated hash for the block of data matches a predefined trigger and, if so, the boundary identification module 206 records a data boundary corresponding with the match. As discussed herein, in some embodiments, the boundary identification module 206 may utilize/apply a bitmask in conjunction with the trigger (e.g., to isolate a set of bits for comparison). For example, in some embodiments, the boundary identification module 206 may compare a fixed number of continuous least significant bits (or most significant bits) to the trigger value and determine whether there is a match. In some embodiments, a match corresponds with a data de-duplication boundary that defines a boundary of a data chunk, which may be utilized for data de-duplication. In such embodiments, the computing device 100 may subsequently perform a cryptographic hash of one or more of the identified data chunks (i.e., data between the boundaries) and compare those cryptographic hashes to determine whether a data chunk is a duplicate of another data chunk.

Figure 3:
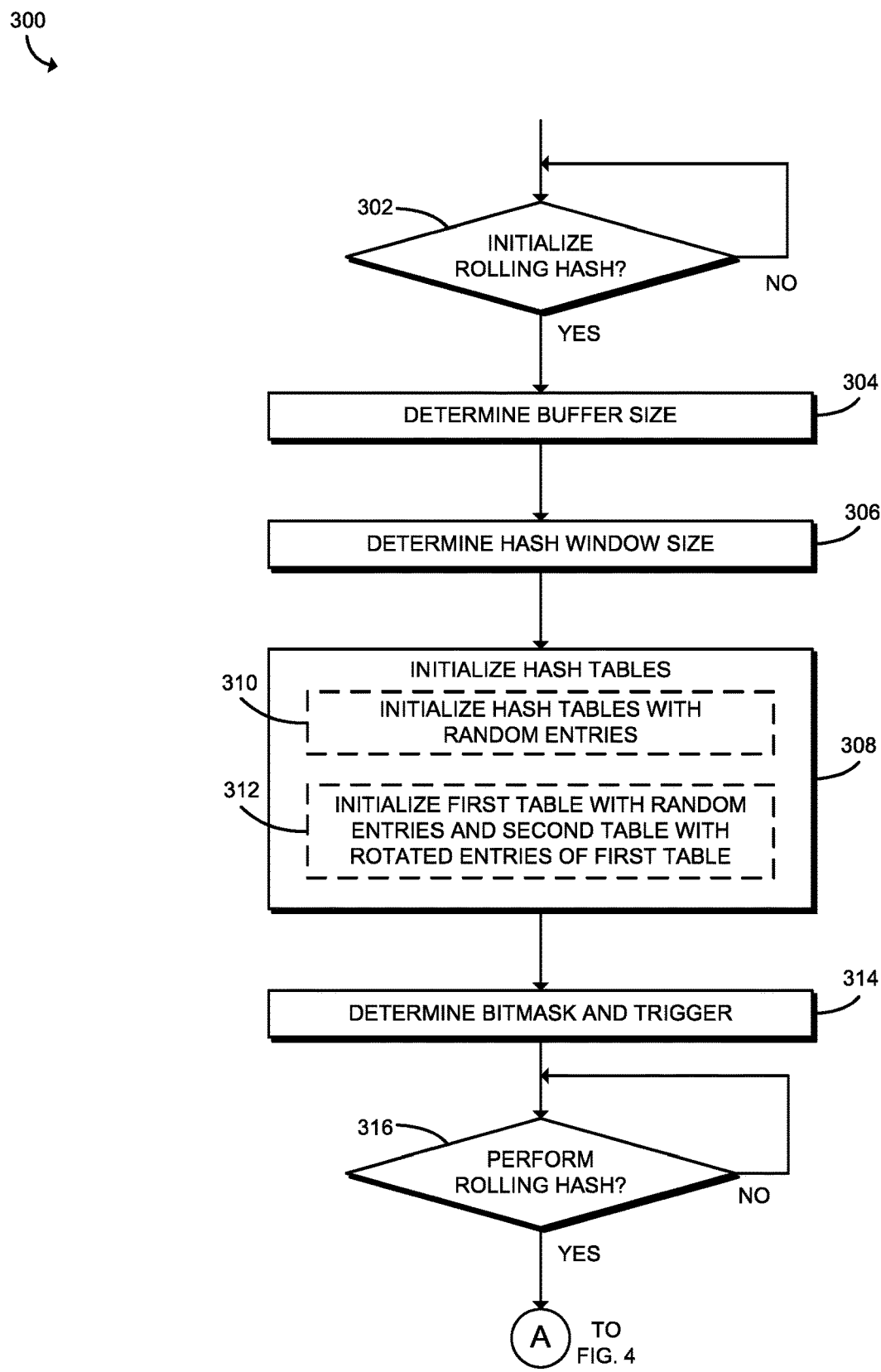
FIGS. 3-4 is a simplified flow diagram of at least one embodiment of a method for computing rolling hashes that may be executed by the computing device of FIG. 1.
Figure 4:
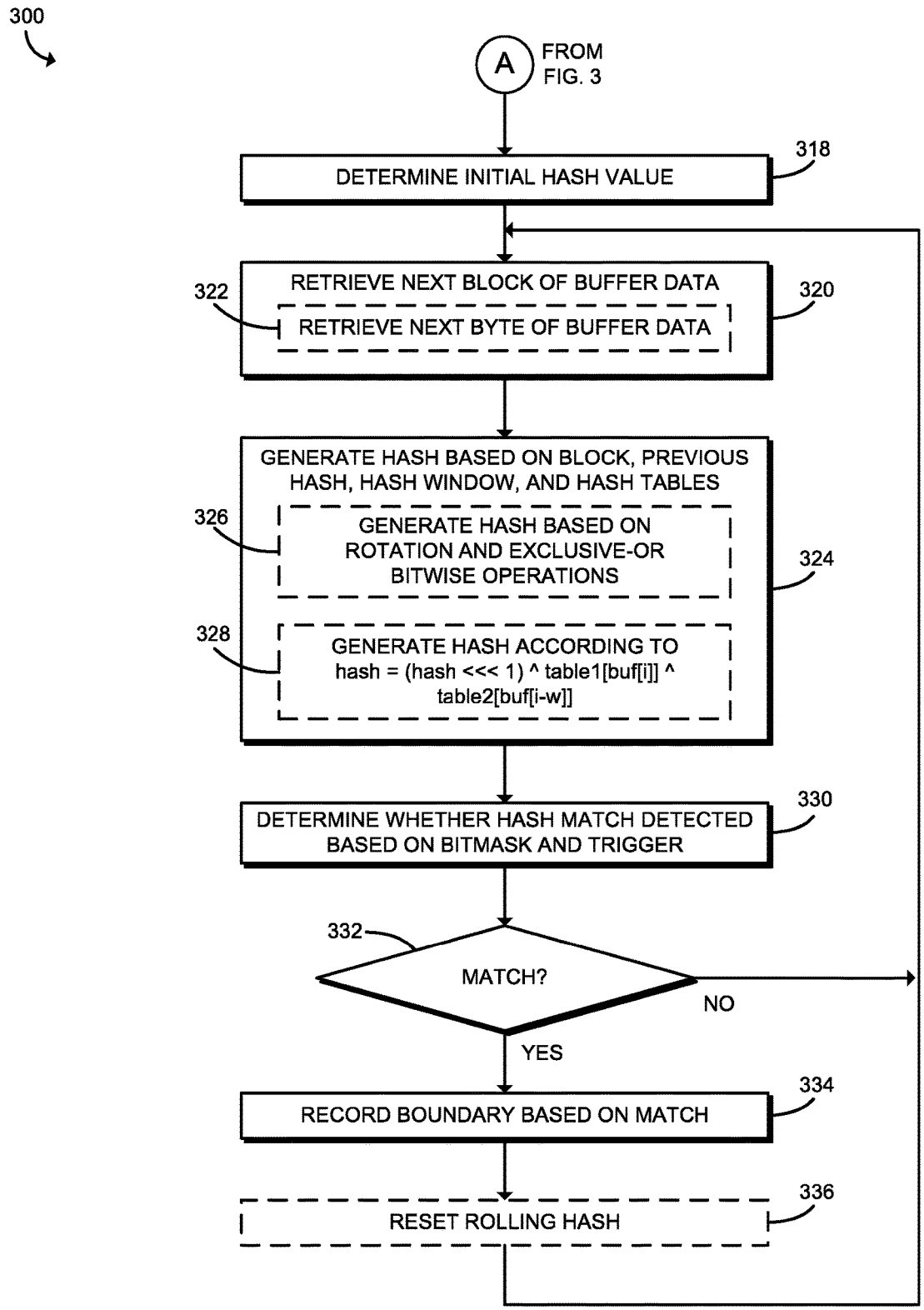

Referring to FIGS. 3-4, in use, the computing device 100 may execute a method 300 for computing rolling hashes. The illustrative method 300 begins with block 302 of FIG. 3 in which the computing device 100 determines whether to initialize the rolling hash algorithm. For example, in some embodiments, one or more rolling hash functions may be initialized, called, and/or reset by virtue of a rolling hash API as described below. It should be appreciated that, in such embodiments, various parameters of the rolling hash may be passed, for example, as parameters to the rolling hash functions. If the computing device 100 determines to initialize the rolling hash algorithm, the computing device 100 determines the size of the data buffer in block 304. In some embodiments, the data buffer and/or a pointer to the data pointer is provided/determined. The size of the data buffer may vary depending on the particular embodiment. In the illustrative embodiment, it should be appreciated that the length of the data buffer is significantly greater than the length of the hash window, w, which often has a size in the range of 20-64 bytes and is fixed for a particular usage (e.g., a particular hash function algorithm).

In block 306, the computing device 100 determines the hash window size, w, of the rolling hash. As described above, in the illustrative embodiment, the size of the hash window is fixed for a particular usage/application. In block 308, the computing device 100 initializes the hash tables 210 utilized by the rolling hash algorithm. In particular, in block 310, the computing device 100 may initialize the hash tables 210 with random-valued entries. More specifically, in block 312, the computing device 100 may initialize a first hash table 210 with random-valued entries and a second hash table 210 with shifted entries relative to the hash table 210. For example, in some embodiments, the second hash table 210 includes the random-valued entries of the first hash table 210 but rotated (e.g., rotated left) by a distance equal to the hash window size, w, such that the index of each random-valued entry is offset by w from its index in the first hash table 210.

In block 314, the computing device 100 determines a bitmask and trigger associated with identification of a data boundary. As discussed above, a bitmask may be utilized on conjunction with the trigger to, for example, isolate a set of bits for comparison (e.g., to compare only the least/most significant bits to the trigger). In block 316, the computing device 100 determines whether to perform the rolling hash. If so, in block 318 of FIG. 4, the computing device determines an initial hash value for the rolling hash (e.g., zero, the value of the last w or other number of bytes, and/or another suitable initial hash value). It should be appreciated that, in some embodiments, it is necessary to identify the initial hash value because each hash value of the rolling hash depends on the previously computed hash.

In block 320, the computing device 100 retrieves the next block of data from the data buffer. For example, in block 322, the computing device 100 may retrieve the next byte of data from the data buffer. In the illustrative embodiment, the computing device 100 retrieves the byte that is next sequentially in the data buffer; however, it should be appreciated that the computing device 100 may retrieve the "next" data block in another suitable pattern (e.g., a deterministic and/or repeatable pattern). As described herein, it should further be appreciated that, in some embodiments, the computing device 100 calculates a hash value for each of the data blocks in the data buffer.

In block 324, the computing device 100 the computing device 100 generates a hash based on the block of data of the data buffer, the previously generated hash (e.g., for the previous block of data), the hash window (w), and the hash tables 210. In some embodiments, in block 326, the computing device 100 may generate the hash based on rotation and exclusive-or bitwise operations. More specifically, in block 328, the computing device 100 may generate the hash according to hash=(hash$_{prev}$<<<1)^table1[buf[i]]^table2[buf[i−w]] as described above. Of course, in other embodiments, the computing device 100 may utilize additional and/or alternative operations for computing rolling hashes according to the principles described herein.

In block 330, the computing device 100 determines whether there is a hash match detected based on the bitmask and trigger established for the rolling hash. In some embodiments, the computing device 100 may do so utilizing, for example, a bitwise comparison function or another suitable mechanism. For example, the computing device 100 may apply the bitmask to the hash (e.g., to isolate one or more bits of the hash for comparison) and compare the masked hash to the trigger in some embodiments. As discussed above, the trigger may be established as any bit arrangement determined or chosen to be representative of a data boundary. If the computing device 100 determines, in block 332, that there is a match, the computing device 100 records a data boundary based on the match in block 334. Further, in some embodiments, the computing device 100 may initialize and/or utilize multiple bitmasks and/or triggers in identifying data boundaries.

In some embodiments, in block 336, the computing device 100 resets the rolling hash in response to identifying a match. It should be appreciated that, in some embodiments, the computing device 100 may resume the rolling hash at the data buffer index immediately following the index for the data block that was just identified as being a match and, therefore, being a data boundary. However, in other embodiments, the computing device 100 may require a minimum data chunk size, minimum buffer size, or some other characteristics. In such embodiments, the computing device 100 may start a new rolling hash at another location of the data buffer (e.g., somewhere in the middle). For example, in an embodiment, the computing device 100 may not permit buffer sizes smaller than 512 bytes in which case the rolling hash may reset/resume at offset+512−w rather than offset+1 in response to identifying a match and boundary at the offset.

The method 300 returns to block 320 in which the computing device 100 retrieves the next block of data (e.g., the next byte) from the data buffer for hash generation. It should be appreciated that, in some embodiments, if no blocks of data remain in the data buffer, the method 300 may terminate. In other words, the illustrative rolling hash algorithm involves iterating through each of the blocks of data of the data buffer (e.g., one byte at a time) and calculating a rolling hash based on hash tables 210, the hash window, the bitmask, and the trigger. The computing device 100 constructs data boundaries (e.g., block or chunk boundaries) at memory locations in which the computing device 100 identifies a match. As described above, the data boundaries may be utilized for a variety of different algorithms including, for example, data de-duplication.

As described above, in some embodiments, the computing device 100 may include a rolling hash API that allows mapping a wide variety of applications (e.g., de-duplications) to the API and efficient library functions. Pseudocode for at least one embodiment of such an API and the corresponding rolling hash scheme is provided below in Table 1. However, it should be appreciated that the pseudocode is provide for exemplary purposes only and the principles described herein are not so limited. Rather, additional and/or alternative code may be utilized to employ the principles described herein in other embodiments.

TABLE 1

Pseudocode for API and Rolling Hash Scheme

```
// The rolling hash scheme
for (i=...) {
    hash = (hash <<< 1) ^ table1[buf[i]] ^ table2[buf[i−w]];
    if ((hash & mask) == trigger) goto hit;
}
// The API:
struct state_t = {
    uint64_t hash;
    uint8_t *delay_line; // can be a fixed small array to hold w bytes,
    instead of pointer
    ...
};
void rolling_hash_ini(state_t *state, uint32_t w);
void rolling_hash_reset(state_t *state, uint8_t *init_bytes);
bool rolling_hash_run(state_t *state, uint8_t *buffer, uint32_t
buffer_len, uint32_t mask, uint32_t trigger, uint32_t *offset);
```

In some embodiments, the rolling_hash_init( ) function of the pseudocode initializes the state for a particular hash window width, w (e.g., 48 bytes) and/or the rolling_hash_reset( ) function may hash w bytes from the supplied buffer. The rolling_hash_run( ) function may continue the hash through "buffer" checking at each byte whether ((hash & mask)==trigger) and, if so, return a value of "true" with the offset of that byte in *offset. If the rolling_hash_run( ) function reaches the end of the buffer without triggering, it may return false. As such, in the illustrative example, the rolling_hash_init( ) function is only called once (i.e., assuming w does not change in an application) and the rolling_hash_reset( ) and rolling_hash_run( ) functions may be called a number of times to run continuously through a buffer. Although the API is defined to be 32-bit and the underlying hash is defined to be 64-bit (i.e., larger) in the illustrative example, the API and/or hash may consist of a different number of bits in other embodiments.

EXAMPLES

Illustrative examples of the technologies disclosed herein are provided below. An embodiment of the technologies may include any one or more, and any combination of, the examples described below.

Example 1 includes a computing device for computing rolling hashes, the computing device comprising a first hash table that includes a first plurality of random-valued entries; a second hash table that includes a second plurality of random-valued entries; a hash generation module to (i) retrieve a block of data from a data buffer and (ii) generate a hash based on the block of data, a previously generated hash, the first hash table, and the second hash table; and a boundary identification module to (i) determine whether the generated hash matches a predefined trigger and (ii) record a data boundary in response to a determination that the generated hash matches the trigger.

Example 2 includes the subject matter of Example 1, and wherein to retrieve the block of data from the data buffer comprises to retrieve a next byte of data from the data buffer.

Example 3 includes the subject matter of any of Examples 1 and 2, and wherein to generate the hash comprises to generate a hash based on rotation and exclusive-or bitwise operations.

Example 4 includes the subject matter of any of Examples 1-3, and wherein the second hash table includes the random-valued entries of the first hash table rotated by a number of table indices equal to a hash window size of a hash algorithm for generation of the hash.

Example 5 includes the subject matter of any of Examples 1-4, and wherein to generate the hash comprises to generate a hash according to hash=(hash$_{prev}$<<<1)^table1[buf[i]]^table2[buf[i−w]]; wherein hash$_{prev}$ is the previously generated hash; wherein hash$_{prev}$<<<1 denotes bitwise rotation of the previously generated hash; wherein ^ denotes an exclusive-or bitwise operation; wherein w is the hash window size of the hash algorithm; wherein buf[i] is the retrieved block of data of the data buffer; wherein buf[i−w] is a previous block of data of the data buffer offset by an index difference equal to the hash window size; wherein table1[buf[i]] is the random-valued entry of the first hash table corresponding with the retrieved block of data; and wherein table2[buf[i−w]] is the random-valued entry of the second hash table corresponding with the previous block of data.

Example 6 includes the subject matter of any of Examples 1-5, and wherein to determine whether the generated hash matches the predefined trigger comprises to apply a bitmask to the generated hash.

Example 7 includes the subject matter of any of Examples 1-6, and wherein to record the data boundary comprises to record a data de-duplication boundary that defines a boundary of a data chunk for data de-duplication.

Example 8 includes the subject matter of any of Examples 1-7, and further including an initialization module to determine an initial hash value.

Example 9 includes the subject matter of any of Examples 1-8, and wherein the previously generated hash is the initial hash value.

Example 10 includes the subject matter of any of Examples 1-9, and further including an initialization module to initialize a rolling hash algorithm to generate the hash.

Example 11 includes the subject matter of any of Examples 1-10, and wherein to initialize the rolling hash algorithm comprises to determine a size of the data buffer.

Example 12 includes the subject matter of any of Examples 1-11, and wherein to initialize the rolling hash algorithm comprises to determine a hash window size of the hash algorithm.

Example 13 includes the subject matter of any of Examples 1-12, and wherein to initialize the rolling hash algorithm comprises to determine a bitmask and the trigger associated with the data boundary.

Example 14 includes the subject matter of any of Examples 1-13, and wherein to initialize the rolling hash algorithm comprises to initialize the first hash table with the first plurality of random-valued entries; and initialize the second hash table with the second plurality of random-valued entries.

Example 15 includes a method for computing rolling hashes by a computing device, the method comprising retrieving, by the computing device, a block of data from a data buffer; generating, by the computing device, a hash based on the block of data, a previously generated hash, a first hash table, and a second hash table, wherein the first hash table includes a first plurality of random-valued entries and the second hash table includes a second plurality of random-valued entries; determining, by the computing device, whether the generated hash matches a predefined trigger; and recording, by the computing device, a data boundary in response to determining that the generated hash matches the trigger.

Example 16 includes the subject matter of Example 15, and wherein retrieving the block of data from the data buffer comprises retrieving a next byte of data from the data buffer.

Example 17 includes the subject matter of any of Examples 15 and 16, and wherein generating the hash comprises generating a hash based on rotation and exclusive-or bitwise operations.

Example 18 includes the subject matter of any of Examples 15-17, and wherein the second hash table includes the random-valued entries of the first hash table rotated by a number of table indices equal to a hash window size of a hash algorithm for generating the hash.

Example 19 includes the subject matter of any of Examples 15-18, and wherein generating the hash comprises generating a hash according to hash=(hash$_{prev}$<<<1)^table1[buf[i]]^table2[buf[i−w]]; wherein hash$_{prev}$ is the previously generated hash; wherein hash$_{prev}$<<<1 denotes bitwise rotation of the previously generated hash; wherein ^ denotes an exclusive-or bitwise operation; wherein w is the hash window size of the hash algorithm; wherein buf[i] is the retrieved block of data of the data buffer; wherein buf[i−w] is a previous block of data of the data buffer offset by an index difference equal to the hash window size; wherein table1[buf[i]] is the random-valued entry of the first hash table corresponding with the retrieved block of data; and wherein table2[buf[i−w]] is the random-valued entry of the second hash table corresponding with the previous block of data.

Example 20 includes the subject matter of any of Examples 15-19, and wherein determining whether the generated hash matches the predefined trigger comprises applying a bitmask to the generated hash.

Example 21 includes the subject matter of any of Examples 15-20, and wherein recording the data boundary comprises recording a data de-duplication boundary that defines a boundary of a data chunk for data de-duplication.

Example 22 includes the subject matter of any of Examples 15-21, and further including determining, by the computing device, an initial hash value.

Example 23 includes the subject matter of any of Examples 15-22, and wherein the previously generated hash is the initial hash value.

Example 24 includes the subject matter of any of Examples 15-23, and further including initializing, by the computing device, a rolling hash algorithm to generate the hash.

Example 25 includes the subject matter of any of Examples 15-24, and wherein initializing the rolling hash algorithm comprises determining a size of the data buffer.

Example 26 includes the subject matter of any of Examples 15-25, and wherein initializing the rolling hash algorithm comprises determining a hash window size of the hash algorithm.

Example 27 includes the subject matter of any of Examples 15-26, and wherein initializing the rolling hash algorithm comprises determining a bitmask and the trigger associated with the data boundary.

Example 28 includes the subject matter of any of Examples 15-27, and wherein initializing the rolling hash algorithm comprises initializing the first hash table with the first plurality of random-valued entries; and initializing the second hash table with the second plurality of random-valued entries.

Example 29 includes a computing device comprising a processor; and a memory having stored therein a plurality of instructions that when executed by the processor cause the computing device to perform the method of any of Examples 15-28.

Example 30 includes one or more machine-readable storage media comprising a plurality of instructions stored thereon that, in response to execution by a computing device, cause the computing device to perform the method of any of Examples 15-28.

Example 31 includes a computing device for computing rolling hashes, the computing device comprising a first hash table that includes a first plurality of random-valued entries; a second hash table that includes a second plurality of random-valued entries; means for retrieving a block of data from a data buffer; means for generating a hash based on the block of data, a previously generated hash, the first hash table, and the second hash table; means for determining whether the generated hash matches a predefined trigger; and means for recording a data boundary in response to determining that the generated hash matches the trigger.

Example 32 includes the subject matter of Example 31, and wherein the means for retrieving the block of data from the data buffer comprises means for retrieving a next byte of data from the data buffer.

Example 33 includes the subject matter of any of Examples 31 and 32, and wherein the means for generating the hash comprises means for generating a hash based on rotation and exclusive-or bitwise operations.

Example 34 includes the subject matter of any of Examples 31-33, and wherein the second hash table includes the random-valued entries of the first hash table rotated by a number of table indices equal to a hash window size of a hash algorithm for generating the hash.

Example 35 includes the subject matter of any of Examples 31-34, and wherein the means for generating the hash comprises means for generating a hash according to hash=$(hash_{prev}\lll 1)\,\hat{}\,table1[buf[i]]\,\hat{}\,table2[buf[i-w]]$; wherein $hash_{prev}$ is the previously generated hash; wherein $hash_{prev}\lll 1$ denotes bitwise rotation of the previously generated hash; wherein $\hat{}$ denotes an exclusive-or bitwise operation; wherein w is the hash window size of the hash algorithm; wherein buf[i] is the retrieved block of data of the data buffer; wherein buf[i−w] is a previous block of data of the data buffer offset by an index difference equal to the hash window size; wherein table1[buf[i]] is the random-valued entry of the first hash table corresponding with the retrieved block of data; and wherein table2[buf[i−w]] is the random-valued entry of the second hash table corresponding with the previous block of data.

Example 36 includes the subject matter of any of Examples 31-35, and wherein the means for determining whether the generated hash matches the predefined trigger comprises means for applying a bitmask to the generated hash.

Example 37 includes the subject matter of any of Examples 31-36, and wherein the means for recording the data boundary comprises means for recording a data de-duplication boundary that defines a boundary of a data chunk for data de-duplication.

Example 38 includes the subject matter of any of Examples 31-37, and further including means for determining an initial hash value.

Example 39 includes the subject matter of any of Examples 31-38, and wherein the previously generated hash is the initial hash value.

Example 40 includes the subject matter of any of Examples 31-39, and further including means for initializing a rolling hash algorithm to generate the hash.

Example 41 includes the subject matter of any of Examples 31-40, and wherein the means for initializing the rolling hash algorithm comprises means for determining a size of the data buffer.

Example 42 includes the subject matter of any of Examples 31-41, and wherein the means for initializing the rolling hash algorithm comprises means for determining a hash window size of the hash algorithm.

Example 43 includes the subject matter of any of Examples 31-42, and wherein the means for initializing the rolling hash algorithm comprises means for determining a bitmask and the trigger associated with the data boundary.

Example 44 includes the subject matter of any of Examples 31-43, and wherein the means for initializing the rolling hash algorithm comprises means for initializing the first hash table with the first plurality of random-valued entries; and means for initializing the second hash table with the second plurality of random-valued entries.

The invention claimed is:

1. A computing device for computing rolling hashes during identification of one or more data chunks to de-duplicate in a data de-duplication operation, the computing device comprising:
   one or more processors; and
   a memory storing a plurality of instructions, which, when executed on the one or more processors, cause the computing device to:
   retrieve, as part of the data de-duplication operation in the memory, a block of data from a data buffer;
   generate, by the one or more processors, a hash based on the block of data, a previously generated hash, a first hash table initialized with a first plurality of random-valued entries, and a second hash table initialized with a second plurality of random-valued entries, wherein the second plurality of random-valued entries is the first plurality of random-valued entries rotated by a number of table indices equal to a hash window size of a hash algorithm;
   determine whether the generated hash matches a predefined trigger;
   record a data boundary in response to a determination that the generated hash matches the trigger, wherein the data boundary is indicative of a data chunk to de-duplicate;
   de-duplicate the data chunk using the recorded data boundary as input; and
   store a result of the de-duplication of the data chunk in the memory.

2. The computing device of claim 1, wherein to retrieve the block of data from the data buffer comprises to retrieve a next byte of data from the data buffer.

3. The computing device of claim 1, wherein to generate the hash comprises to generate a hash based on rotation and exclusive-or bitwise operations.

4. The computing device of claim 1, wherein to generate the hash comprises to generate a hash according to hash=$(hash_{prev}\lll 1)\,\hat{}\,table1[buf[i]]\,\hat{}\,table2[buf[i-w]]$;
   wherein $hash_{prev}$ is the previously generated hash;
   wherein $hash_{prev}\lll 1$ denotes bitwise rotation of the previously generated hash;
   wherein $\hat{}$ denotes an exclusive-or bitwise operation;
   wherein w is the hash window size of the hash algorithm;
   wherein buf[i] is the retrieved block of data of the data buffer;
   wherein buf[i−w] is a previous block of data of the data buffer offset by an index difference equal to the hash window size;

wherein table1[buf[i]] is the random-valued entry of the first hash table corresponding with the retrieved block of data; and wherein table2[buf[i−w]] is the random-valued entry of the second hash table corresponding with the previous block of data.

5. The computing device of claim 1, wherein to determine whether the generated hash matches the predefined trigger comprises to apply a bitmask to the generated hash.

6. The computing device of claim 1, wherein to record the data boundary comprises to record a data de-duplication boundary that defines a boundary of a data chunk for the data de-duplication.

7. The computing device of claim 1, wherein the plurality of instructions further causes the computing device to determine an initial hash value.

8. The computing device of claim 7, wherein the initial hash value is indicative of a value at which to start the rolling hashes.

9. The computing device of claim 1, wherein the plurality of instructions further causes the computing device to initialize a rolling hash algorithm to generate the hash.

10. The computing device of claim 9, wherein to initialize the rolling hash algorithm comprises to determine a size of the data buffer.

11. The computing device of claim 9, wherein to initialize the rolling hash algorithm comprises to determine a hash window size of the hash algorithm.

12. The computing device of claim 9, wherein to initialize the rolling hash algorithm comprises to determine a bitmask and the trigger associated with the data boundary.

13. One or more non-transitory machine-readable storage media comprising a plurality of instructions stored thereon that, in response to execution by a computing device, cause the computing device to:

retrieve, as part of a data de-duplication operation in a memory of the computing device, a block of data from a data buffer;

generate, by one or more processors, a hash based on the block of data, a previously generated hash, a first hash table initialized with a first plurality of random-valued entries, and a second hash table initialized with a second plurality of random-valued entries, wherein the second plurality of random-valued entries is the first plurality of random-valued entries rotated by a number of table indices equal to a hash window size of a hash algorithm;

determine whether the generated hash matches a predefined trigger;

record a data boundary in response to a determination that the generated hash matches the trigger, wherein the data boundary is indicative of a data chunk to de-duplicate;

de-duplicate the data chunk using the recorded data boundary as input; and store a result of the de-duplication of the data chunk in the memory of the computing device.

14. The one or more non-transitory machine-readable storage media of claim 13, wherein to retrieve the block of data from the data buffer comprises to retrieve a next byte of data from the data buffer.

15. The one or more non-transitory machine-readable storage media of claim 13, wherein the second hash table includes the random-valued entries of the first hash table rotated by a number of table indices equal to a hash window size of a hash algorithm for generating the hash;

wherein to generate the hash comprises to generate a hash according to hash=(hash$_{prev}$<<<1) ∧ table1[buf[i]] ^table2[buf[i−w]];

wherein hash$_{prev}$ is the previously generated hash;

wherein hash$_{prev}$<<<1 denotes bitwise rotation of the previously generated hash;

wherein ^ denotes an exclusive-or bitwise operation;

wherein w is the hash window size of the hash algorithm;

wherein buf[i] is the retrieved block of data of the data buffer;

wherein buf[i−w] is a previous block of data of the data buffer offset by an index difference equal to the hash window size;

wherein table1[buf[i]] is the random-valued entry of the first hash table corresponding with the retrieved block of data; and wherein table2[buf[i−w]] is the random-valued entry of the second hash table corresponding with the previous block of data.

16. The one or more non-transitory machine-readable storage media of claim 13, wherein to determine whether the generated hash matches the predefined trigger comprises to apply a bitmask to the generated hash.

17. The one or more non-transitory machine-readable storage media of claim 13, wherein the plurality of instructions further cause the computing device to initialize a rolling hash algorithm to generate the hash.

18. The one or more non-transitory machine-readable storage media of claim 17, wherein to initialize the rolling hash algorithm comprises to determine a size of the data buffer.

19. The one or more non-transitory machine-readable storage media of claim 17, wherein to initialize the rolling hash algorithm comprises to determine a hash window size of the hash algorithm.

20. The one or more non-transitory machine-readable storage media of claim 17, wherein to initialize the rolling hash algorithm comprises to determine a bitmask and the trigger associated with the data boundary.

21. A method for computing rolling hashes by a computing device during identification of one or more data chunks in memory to de-duplicate in a data de-duplication operation, the method comprising:

retrieving, by the computing device as part of the data de-duplication operation in the memory, a block of data from a data buffer;

generating, by one or more processors of the computing device, a hash based on the block of data, a previously generated hash, a first hash table initialized with a first plurality of random-valued entries, and a second hash table initialized with a second plurality of random-valued entries, wherein the second plurality of random-valued entries is the first plurality of random-valued entries rotated by a number of table indices equal to a hash window size of a hash algorithm;

determining, by the computing device, whether the generated hash matches a predefined trigger;

recording, by the computing device, a data boundary in response to determining that the generated hash matches the trigger, wherein the data boundary is indicative of a data chunk to de-duplicate;

de-duplicating the data chunk using the recorded data boundary as input; and storing a result of the de-duplication of the data chunk in a memory of the computing device.

22. The method of claim 21, wherein retrieving the block of data from the data buffer comprises retrieving a next byte of data from the data buffer.

23. The method of claim 21, wherein the second hash table includes the random-valued entries of the first hash table rotated by a number of table indices equal to a hash window size of a hash algorithm for generating the hash;
- wherein generating the hash comprises generating a hash according to hash=(hash$_{prev}$<<<1) ^ table1[buf[i]] ^table2[buf[i−w]];
- wherein hash$_{prev}$ is the previously generated hash;
- wherein hash$_{prev}$<<<1 denotes bitwise rotation of the previously generated hash;
- wherein ^ denotes an exclusive-or bitwise operation;
- wherein w is the hash window size of the hash algorithm;
- wherein buf[i] is the retrieved block of data of the data buffer;
- wherein buf[i−w] is a previous block of data of the data buffer offset by an index difference equal to the hash window size;
- wherein table1[buf[i]] is the random-valued entry of the first hash table corresponding with the retrieved block of data; and
- wherein table2[buf[i−w]] is the random-valued entry of the second hash table corresponding with the previous block of data.

* * * * *